(12) United States Patent
Iguchi

(10) Patent No.: US 8,717,760 B2
(45) Date of Patent: May 6, 2014

(54) ELECTRIC POWER CONVERSION APPARATUS

(75) Inventor: Satoshi Iguchi, Kariya (JP)

(73) Assignee: Denso Corporation, Kariya (JP)

( * ) Notice: Subject to any disclaimer, the term of this patent is extended or adjusted under 35 U.S.C. 154(b) by 254 days.

(21) Appl. No.: 13/427,094

(22) Filed: Mar. 22, 2012

(65) Prior Publication Data

US 2012/0250252 A1   Oct. 4, 2012

(30) Foreign Application Priority Data

Mar. 29, 2011   (JP) .................................. 2011-072706
Oct. 28, 2011   (JP) .................................. 2011-237807

(51) Int. Cl.
*H05K 7/20*   (2006.01)

(52) U.S. Cl.
USPC .......... 361/689; 361/699; 361/704; 165/80.4; 174/15.1

(58) Field of Classification Search
None
See application file for complete search history.

(56) References Cited

U.S. PATENT DOCUMENTS

| | | | | |
|---|---|---|---|---|
| 6,661,659 B2 * | 12/2003 | Tamba et al. | ................. | 361/699 |
| 7,009,842 B2 * | 3/2006 | Tilton et al. | ................. | 361/699 |
| 7,019,395 B2 * | 3/2006 | Hirano et al. | ................. | 257/717 |
| 7,710,721 B2 * | 5/2010 | Matsuo et al. | ................. | 361/699 |
| 7,755,898 B2 * | 7/2010 | Aoki et al. | ................. | 361/710 |
| 7,907,408 B2 * | 3/2011 | Ippoushi et al. | ................. | 361/700 |
| 8,212,382 B2 * | 7/2012 | Nakatsu et al. | ................. | 307/9.1 |
| 2005/0128706 A1 * | 6/2005 | Maly et al. | ................. | 361/699 |
| 2006/0284308 A1 | 12/2006 | Harada et al. | | |
| 2008/0130223 A1 | 6/2008 | Nakamura et al. | | |
| 2011/0116235 A1 * | 5/2011 | Ryu et al. | ................. | 361/699 |

FOREIGN PATENT DOCUMENTS

| | | |
|---|---|---|
| JP | 2005-073374 | 3/2005 |
| JP | 2005-137116 | 5/2005 |
| JP | 2006-134904 | 5/2006 |
| JP | 2007-174759 | 7/2007 |
| JP | 2008-118753 | 5/2008 |
| JP | 2009-148027 | 7/2009 |

OTHER PUBLICATIONS

Office Action (2 pages) dated Jul. 24, 2013, issued in corresponding Japanese Application No. 2011-237807 and English translation (2 pages).

* cited by examiner

*Primary Examiner* — Boris Chervinsky
(74) *Attorney, Agent, or Firm* — Nixon & Vanderhye PC

(57) ABSTRACT

An electric power conversion apparatus includes first and second electric power conversion devices and a housing. The first and second electric power conversion devices are arranged to overlap each other in an overlap direction. The housing receives both the first and second electric power conversion devices therein. The housing has a partition wall that extends between the first and second electric power conversion devices to partition the housing into first and second parts in which the first and second electric power conversion devices are respectively received. The partition wall has a coolant passage formed therein, thereby allowing a coolant to flow through the coolant passage.

11 Claims, 7 Drawing Sheets

ELECTRIC POWER CONVERSION APPARATUS

CROSS-REFERENCE TO RELATED APPLICATIONS

This application is based on and claims priority from Japanese Patent Applications No. 2011-72706 filed on Mar. 29, 2011 and No. 2011-237807 filed on Oct. 28, 2011, the contents of which are hereby incorporated by reference in their entireties into this application.

BACKGROUND

1. Technical Field

The present invention relates to electric power conversion apparatuses that include electric power conversion devices such as an inverter and a converter.

2. Description of the Related Art

Motor vehicles, such as an electric vehicle and a hybrid vehicle, are generally equipped with electric power conversion devices such as an inverter that converts DC (Direct Current) power into AC (Alternating Current) power and a converter that converts DC power of one voltage into DC power of another voltage.

Moreover, electric power conversion devices generally generate a large amount of heat due to the large electric currents flowing therein. Therefore, it is necessary to suppress increase in the temperature of the electric power conversion devices.

For example, Japanese Patent Application Publication No. 2009-148027 discloses an electric power conversion apparatus which includes an inverter and a converter that are integrally configured with each other. Moreover, to suppress increase in the temperature of the inverter and the converter, the electric power conversion apparatus further includes two cooling devices for respectively cooling the inverter and the converter.

However, even with the two cooling devices, local increase in the ambient temperature inside the electric power conversion apparatus may occur depending on the arrangement of the inverter, the converter and the two cooling devices in the electric power conversion apparatus.

SUMMARY

According to an exemplary embodiment, there is provided an electric power conversion apparatus which includes first and second electric power conversion devices and a housing. The first and second electric power conversion devices are arranged to overlap each other in an overlap direction. The housing receives both the first and second electric power conversion devices therein. The housing has a partition wall that extends between the first and second electric power conversion devices to partition the housing into first and second parts in which the first and second electric power conversion devices are respectively received. The partition wall has a coolant passage formed therein, thereby allowing a coolant to flow through the coolant passage.

With the above configuration, it is possible to cool the housing by the coolant flowing through the coolant passage. As a result, it is possible to lower the ambient temperature in the entire space inside the housing, without local increase in the ambient temperature. In other words, it is possible to suppress increase in the ambient temperature in the entire space inside the housing.

Moreover, with the above configuration, the partition wall of the housing is interposed between the first and second electric power conversion devices and has the coolant passage formed therein. Consequently, it is possible to prevent thermal interference between the first and second electric power conversion devices each of which generates heat during operation. As a result, it is possible to more effectively suppress increase in the ambient temperature in the entire space inside the housing.

Furthermore, with the coolant passage interposed between the first and second electric power conversion devices, it is possible to prevent interference of electromagnetic noise between the first and second electric power conversion devices.

In addition, the first and second electric power conversion devices are arranged to overlap each other in the overlap direction, with the partition wall of the housing interposed therebetween. With such an arrangement, it is possible to minimize the size of the electric power conversion apparatus.

Preferably, the housing also has a plurality of side walls that each extend in the overlap direction and together enclose both the first and second electric power conversion devices.

With the above configuration, since the first and second electric power conversion devices, each of which generates heat during operation, are enclosed by the housing that is cooled by the coolant flowing through the coolant passage formed in the partition wall, it is possible to further effectively suppress increase in the ambient temperature in the entire space inside the housing.

It is preferable that each of the first and second electric power conversion devices is arranged in contact with or in close proximity to the housing that includes the partition wall.

With the above arrangement, it is possible to suppress increase in the temperature of the first and second electric power conversion devices by the housing that is cooled by the coolant flowing through the coolant passage formed in the partition wall.

In one further implementation, the coolant passage is made up of a recess that is formed in a surface of the partition wall of the housing, the surface facing one of the first and second electric power conversion devices. Further, the one of the first and second electric power conversion devices is disposed in contact with the surface of the partition wall so as to cover the recess formed in the surface.

With the above configuration, the one of the first and second electric power conversion devices faces the coolant passage and is thus exposed to the coolant flowing through the coolant passage. Consequently, it is possible to cool, with the coolant flowing through the coolant passage, the one of the first and second electric power conversion devices as well as the housing.

Further, the one of the first and second electric power conversion devices is hermetically fixed to the surface of the partition wall of the housing. Consequently, it is possible to ensure the hermeticity of the coolant passage.

In addition, it is preferable to form heat-radiating fins on a surface of the one of the first and second electric power conversion devices, the surface facing the coolant passage, thereby improving the cooling performance.

In another further implementation, the coolant passage is made up of a recess that is formed in a surface of the partition wall of the housing. The recess is covered by a lid member that has an opposite pair of first and second surfaces. The first surface abuts the surface of the partition wall of the housing, and the second surface has one of the first and second electric power conversion devices mounted thereon.

With the above configuration, the one of the first and second electric power conversion devices can be cooled by the coolant flowing through the coolant passage via the lid member. In addition, since the one of the first and second electric power conversion devices is mounted on the second surface of the lid member, it is possible to more easily replace the device when necessary.

Further, the lid member is hermetically fixed to the surface of the partition wall of the housing. Consequently, it is possible to ensure the hermeticity of the coolant passage.

In addition, it is preferable to form heat-radiating fins on the first surface of the lid member, thereby improving the cooling performance.

It should be noted that the coolant passage may be formed on either or both sides of the partition wall of the housing in the overlap direction.

It also should be noted that the coolant passage may be provided in other forms than the recesses as described above, for example a through-hole formed in the partition wall.

It also should be noted that more than one coolant passage may be formed in the partition wall of the housing.

Preferably, the first electric power conversion device is an inverter that converts DC power into AC power, and the second electric power conversion device is a converter that converts DC power of one voltage into DC power of another voltage.

Consequently, with the combination of the inverter and the converter, it is possible for the electric power conversion apparatus to satisfy the requirements of electric power conversion in an electric vehicle or a hybrid vehicle.

More preferably, the inverter includes at least one semiconductor module and at least one cooling portion for cooling the at least one semiconductor module. The converter is disposed to abut the coolant passage formed in the partition wall of the housing, so as to be cooled by the coolant flowing through the coolant passage.

Consequently, the at least one semiconductor module can be cooled by the at least one cooling portion while the converter is cooled by the coolant flowing through the coolant passage. As a result, it is possible to sufficiently cool each of the inverter and the converter, thereby effectively suppressing increase in the ambient temperature in the entire space inside the housing.

The at least one semiconductor module may be a plurality of semiconductor modules. The at least one cooling portion may be a plurality of cooling pipes through which the coolant flows. In this case, it is preferable that the semiconductor modules are alternately stacked with the cooling pipes.

Consequently, it is possible to more effectively cool the semiconductor modules with the coolant flowing through the cooling pipes.

Furthermore, the inverter may further include at least one electronic component in addition to the at least one semiconductor module and the at least one cooling portion. In this case, it is preferable that the at least one electronic component is disposed so as to be directly or indirectly cooled by the coolant flowing through the coolant passage formed in the partition wall of the housing.

Here, "the at least one electronic component is disposed so as to be directly cooled by the coolant" means that the at least one electronic component is disposed so as to be directly exposed to and thus directly thermally connected to the coolant flowing through the coolant passage. On the other hand, "the at least one electronic component is disposed so as to be indirectly cooled by the coolant" means that the at least one electronic component is disposed so as to be indirectly thermally connected to the coolant flowing through the coolant passage via a heat-conductive member, such as the partition wall of the housing.

Preferably, the electric power conversion apparatus is used in a motor vehicle, such as an electric vehicle or a hybrid vehicle.

As described previously, it is possible to effectively suppress increase in the ambient temperature in the entire space inside the housing; thus, it is possible to ensure the heat resistance of the electric power conversion apparatus. Moreover, with the arrangement of the first and second electric power conversion devices in the housing, it is possible to minimize the size of the electric power conversion apparatus. As a result, in the case of the electric power conversion apparatus being used in a motor vehicle, it is possible to improve flexibility in mounting the electric power conversion apparatus in the motor vehicle.

BRIEF DESCRIPTION OF THE DRAWINGS

The present invention will be understood more fully from the detailed description given hereinafter and from the accompanying drawings of exemplary embodiments, which, however, should not be taken to limit the invention to the specific embodiments but are for the purpose of explanation and understanding only.

In the accompanying drawings.

DESCRIPTION OF EMBODIMENTS

Figure 1:
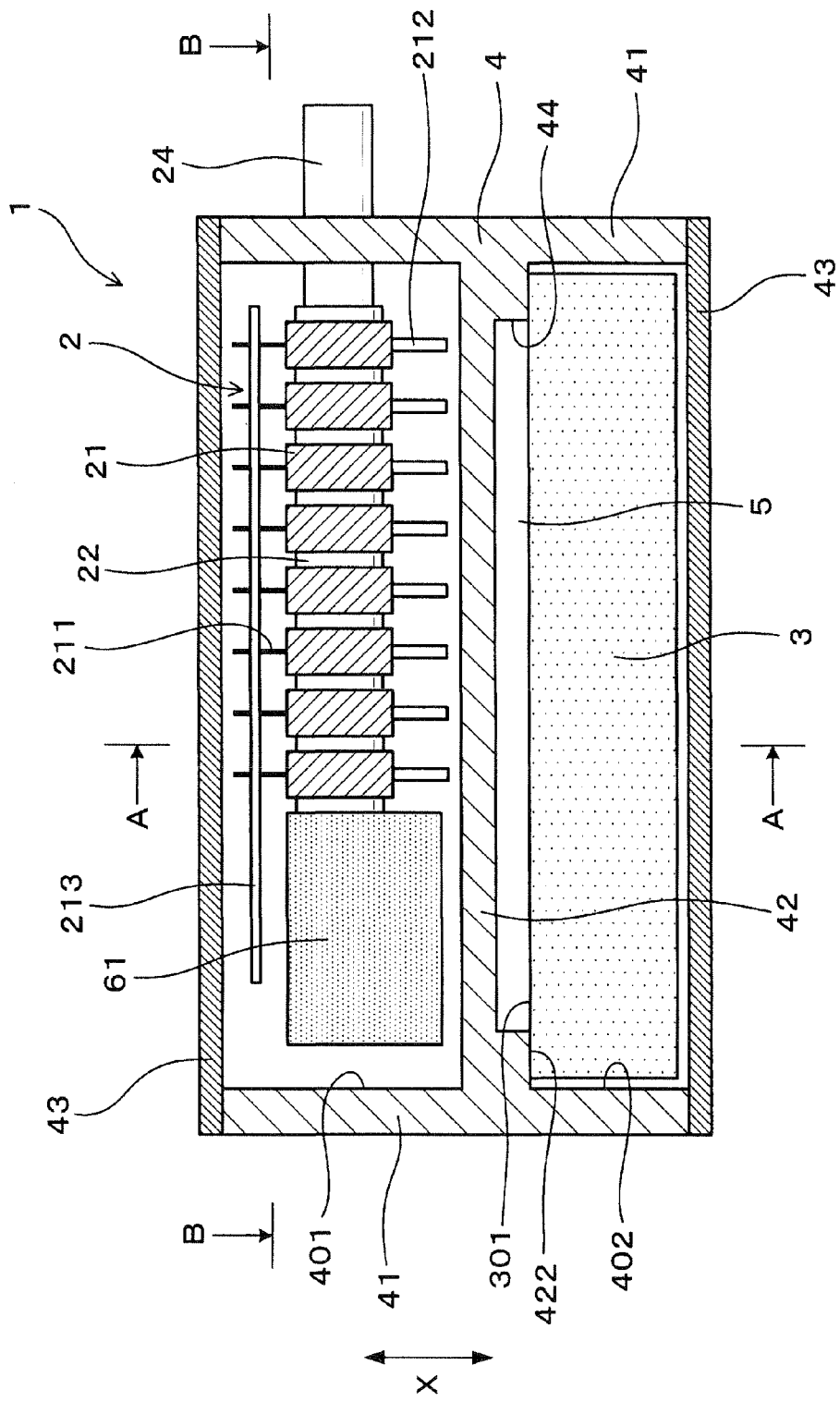
FIG. 1 is a schematic view illustrating the overall configuration of an electric power conversion apparatus according to a first embodiment.

Exemplary embodiments will be described hereinafter with reference to FIGS. 1-7. It should be noted that for the sake of clarity and understanding, identical components having identical functions in different embodiments have been marked, where possible, with the same reference numerals in each of the figures and that for the sake of avoiding redundancy, descriptions of the identical components will not be repeated.

First Embodiment

Figure 2:
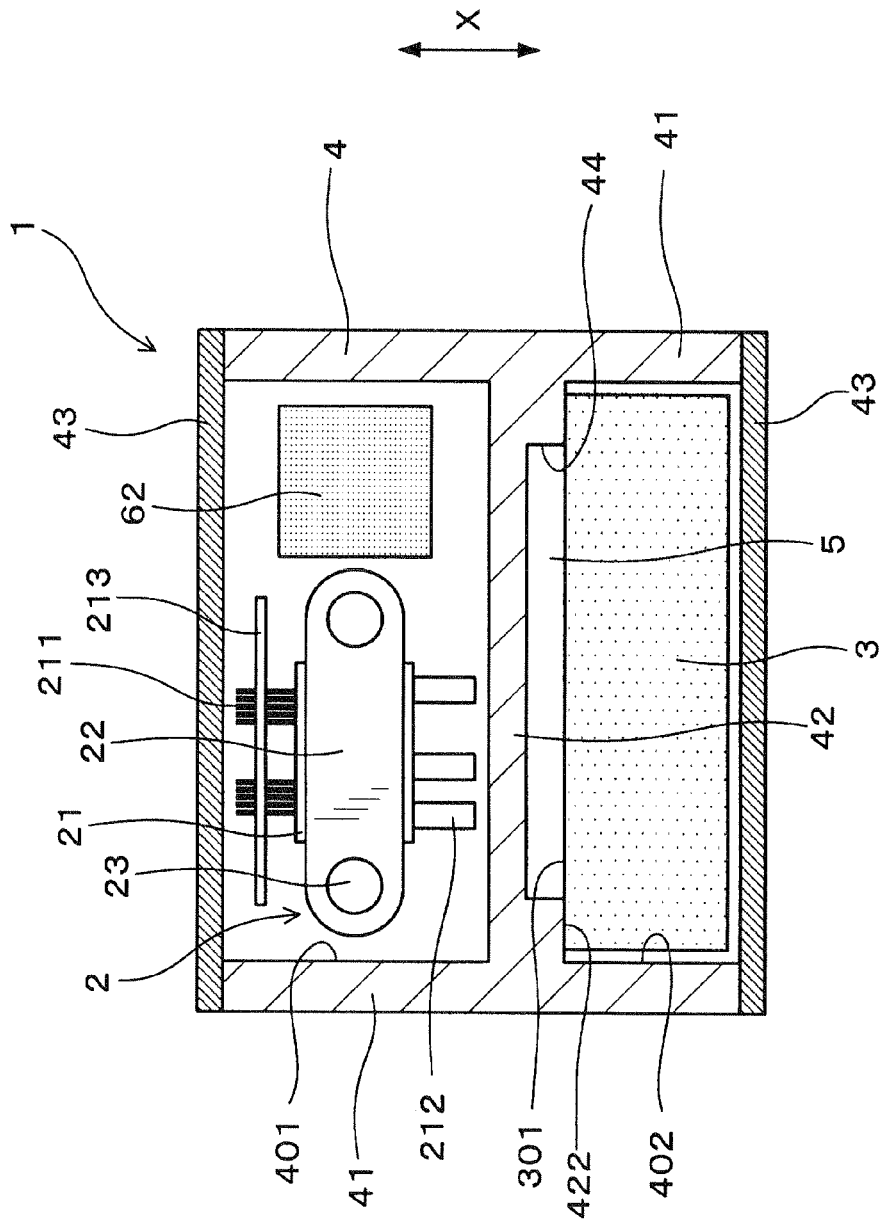
FIG. 2 is a cross-sectional view taken along the line A-A in FIG. 1.
Figure 3:
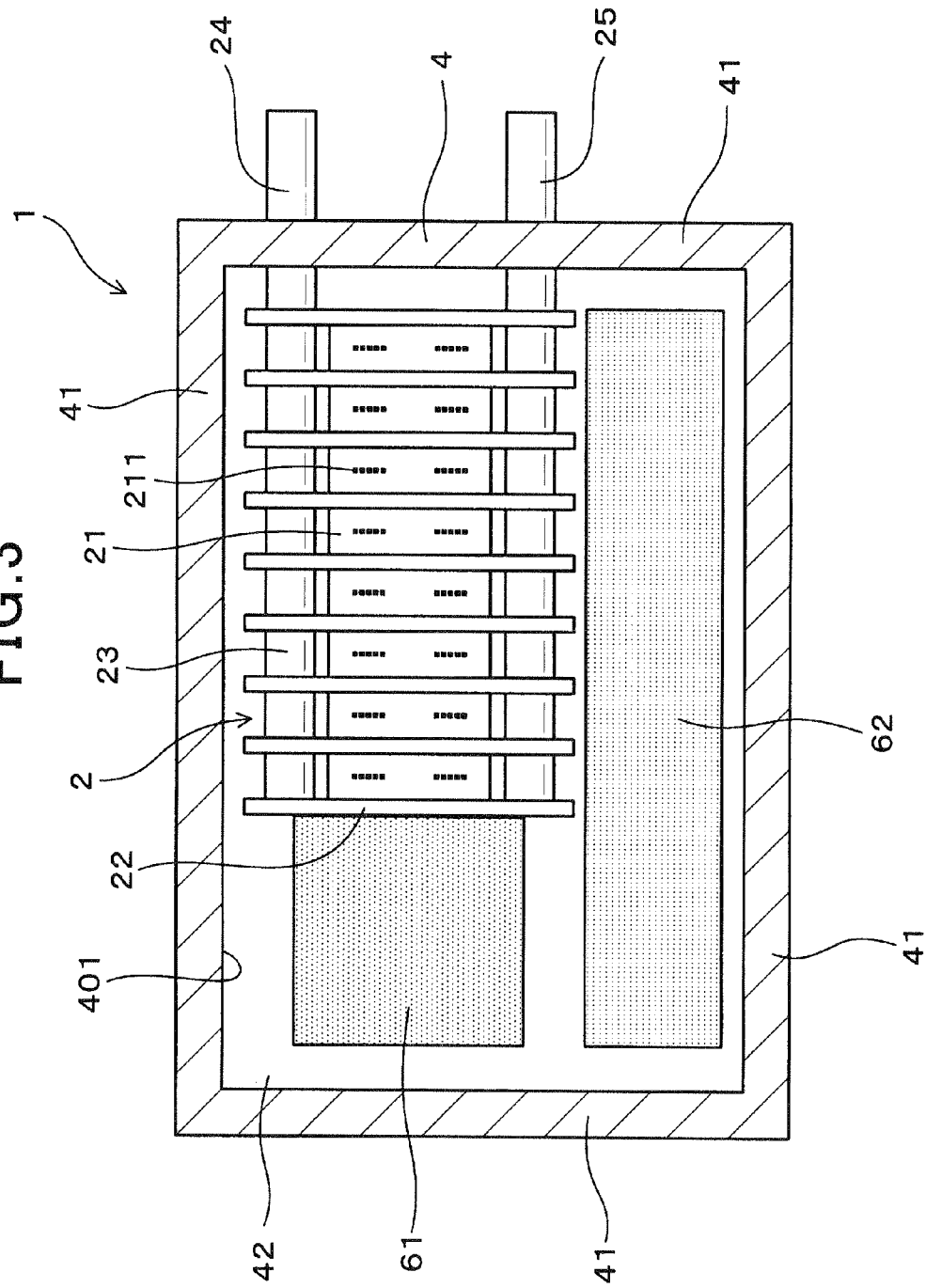
FIG. 3 is a cross-sectional view taken along the line B-B in FIG. 1.

Referring to FIGS. 1-3, an electric power conversion apparatus 1 according to a first embodiment includes first and second electric power conversion devices 2 and 3 that are arranged to overlap each other in the vertical direction X, and a housing 4 that receives both the first and second electric power conversion devices 2 and 3 therein. The housing 4 has a partition wall 42 that is formed to partition the housing 4 between the first and second electric power conversion devices 2 and 3. In other words, the partition wall 42 extends between the first and second electric power conversion devices 2 and 3 to partition the housing 4 into two parts in which the first and second electric power conversion devices 2 and 3 are respectively received. Further, the partition wall 42 has a coolant passage 5 formed therein.

Specifically, in the present embodiment, as shown in FIGS. 1 and 2, the housing 4 has four side walls 41 each extending vertically and the partition wall 42 that extends horizontally to partition the space enclosed by the four side walls 41. Consequently, the housing 4 is given a substantially "H"-shaped cross section parallel to the vertical direction X and partitioned into an upper part 401 and a lower part 402. The upper part 401 has an open end on the upper side of the housing 4, while the lower part 402 has an open end on the lower side. Further, each of the open ends of the upper and lower parts 401 and 402 of the housing 4 is closed by a cover 43.

Moreover, in the present embodiment, the first electric conversion device 2 is implemented by an inverter that converts DC power into AC power.

The inverter 2 is received in the upper part 401 of the housing 4. On the other hand, the second electric conversion device 3 is implemented by a converter that converts DC power of one voltage into DC power of another voltage. The converter 3 is received in the lower part 402 of the housing 4.

That is, the inverter 2 and the converter 3 are arranged in the housing 4 so as to overlap each other in the vertical direction X with the partition wall 42 extending therebetween. In addition, both the inverter 2 and the converter 3 are enclosed by the four side walls 41 of the housing 4 each of which extends in the vertical direction X.

Further, as shown in FIGS. 1 and 3, the inverter 2 includes a plurality of semiconductor modules 21 and a plurality of cooling pipes 22 that are alternately stacked with the semiconductor modules 21 in a horizontal direction (i.e., the left-right direction in FIGS. 1 and 3). That is, each of the semiconductor modules 21 is held between one adjacent pair of the cooling pipes 22 in the horizontal direction (or the stacking direction).

Each of the semiconductor modules 21 has semiconductor elements built therein. The semiconductor elements include switching elements, such as an IGBT (Insulated Gate Bipolar Transistor), and diodes such as an FWD (Free Wheeling Diode). On the other hand, each of the cooling pipes 22 has a coolant passage formed therein, so that a coolant can flow through the coolant passages formed in the cooling pipes 22 to cool the semiconductor modules 21.

Moreover, for each adjacent pair of the cooling pipes 22, there are provided two connecting pipes 23 that respectively connect two pairs of corresponding end portions of the cooling pipes 22. Further, there are also provided an inlet pipe 24 and an outlet pipe 25 that are respectively connected to opposite end portions of that one of the cooling pipes 22 which is located at one end (i.e., the right end in FIG. 3) of the stack of the semiconductor modules 21 and the cooling pipes 22.

In operation, the coolant is introduced into the cooling pipe 22 located at the end of the stack of the semiconductor modules 21 and the cooling pipes 22 via the inlet pipe 24, distributed by the connecting pipes 23 to flow through all the cooling pipes 22, and discharged out of the cooling pipe 22 located at the end of the stack via the outlet pipe 25. Consequently, the semiconductor modules 21 are cooled by the coolant flowing through the cooling pipes 22.

In addition, as the coolant flowing through the cooling pipes 22, any of the following coolants can be used: a natural coolant, such as water and ammonia; water mixed with an ethylene glycol-based antifreeze liquid; a fluorocarbon coolant such as fluorinert; a flow coolant such as HCFC123 and HFC134a; an alcohol coolant such as methanol; and a ketone coolant such as acetone.

Each of the semiconductor modules 21 also includes, as shown in FIGS. 1 and 2, control terminals 211 that protrude upward and electrode terminals 212 that protrude downward. The control terminals 211 are connected to a control circuit board 213 that is located upside of the semiconductor modules 21 in the upper part 401 of the housing 4. On the other hand, the electrode terminals 212 are connected to corresponding bus bars that are not shown in the figures.

In operation, control current for controlling the switching elements of the semiconductor modules 21 is input from the control circuit board 213 to the semiconductor modules 21 via the respective control terminals 211. On the other hand, via the respective electrode terminals 212, DC power is input from a DC power source (not shown) to the semiconductor modules 21 while AC power is output from the semiconductor modules 21 to an AC load (not shown).

Moreover, as shown in FIG. 3, in the upper part 401 of the housing 4, there are also received a reactor 61 and a capacitor 62 of the inverter 2. The reactor 61 makes up a part of a boosting circuit for boosting the voltage of the DC power input to the semiconductor modules 21. The reactor 61 is arranged so as to adjoin the other end (i.e., the left end in FIG. 3) of the stack of the semiconductor modules 21 and the cooling pipes 22. On the other hand, the capacitor 62 is provided to smooth the voltage of the DC power before or after being boosted. The capacitor 62 is arranged parallel to both the reactor 61 and the stack of the semiconductor modules 21 and the cooling pipes 22.

In the present embodiment, as shown in FIGS. 1 and 2, the partition wall 42 of the housing 4 has a coolant passage 5 formed therein.

More specifically, in the present embodiment, the coolant passage 5 is provided in the form of a recess 44 which is formed in a lower surface 422 of the partition wall 42 and covered by the converter 3 that is disposed in contact with the lower end surface 422.

Further, in the present embodiment, the converter 3 is fixed, for example by bolts (not shown), to the lower surface 422 of the partition wall 42 via a seal member (not shown) such as a liquid gasket and rubber. In other words, the converter 3 is hermetically fixed to the lower surface 422 of the partition wall 42. Consequently, the hermeticity (or airtightness) of the coolant passage 5 is ensured.

In addition, as the coolant flowing through the coolant passage 5, it is possible to use any of the above-described coolants that can also be used as the coolant flowing through the cooling pipes 22 of the inverter 2. Further, it is also possible to form heat-radiating fins on an upper surface 301 of the converter 3 which faces the coolant passage 5, thereby improving the cooling performance.

Next, the advantages of the electric power conversion apparatus 1 according to the present embodiment will be described.

In the present embodiment, the electric power conversion apparatus 1 includes the inverter 2 and the converter 3 that are arranged to overlap each other in the vertical direction X (i.e., the overlap direction), and the housing 4 that receives both the inverter 2 and the converter 3 therein. The housing 4 has the partition wall 42 that extends horizontally between the inverter 2 and the converter 3 to partition the housing 1 into the upper and lower parts 401 and 402 in which the inverter 2 and the converter 3 are respectively received. Further, the partition wall 42 has the coolant passage 5 formed therein.

With the above configuration, it is possible to cool the housing 4 by the coolant flowing through the coolant passage 5 formed in the partition wall 42 of the housing 4. As a result, it is possible to lower the ambient temperature in the entire space inside the housing 4, without local increase in the ambient temperature. In other words, it is possible to suppress increase in the ambient temperature in the entire space inside the housing 4.

Moreover, with the above configuration, the partition wall 42 of the housing 4 is interposed between the inverter 2 and the converter 3 and has the coolant passage 5 formed therein. Consequently, it is possible to prevent thermal interference between the inverter 2 and the converter 3 each of which generates heat during operation. As a result, it is possible to more effectively suppress increase in the ambient temperature in the entire space inside the housing 4.

Furthermore, with the coolant passage 5 interposed between the inverter 2 and the converter 3, it is possible to prevent interference of electromagnetic noise between the inverter 2 and the converter 3.

In addition, the inverter 2 and the converter 3 are arranged to overlap each other in the vertical direction X with the partition wall 42 of the housing 4 interposed therebetween. With such an arrangement, it is possible to minimize the size of the electric power conversion apparatus 1.

In the present embodiment, the housing 4 has the four side walls 41 that each extend in the vertical direction X and together enclose both the inverter 2 and the converter 3.

With the above configuration, since the inverter 2 and the converter 3, each of which generates heat during operation, are enclosed by the housing 4 that is cooled by the coolant flowing through the coolant passage 5 formed in the partition wall 42, it is possible to further effectively suppress increase in the ambient temperature in the entire space inside the housing 4.

Further, in the present embodiment, the housing 4 has the substantially "H"-shaped cross section parallel to the vertical direction X and partitioned by the partition wall 42 into the upper and lower parts 401 and 402. The upper part 401 has the open end on the upper side of the housing 4, while the lower part 402 has the open end on the lower side.

With the above configuration, it is possible to easily replace the inverter 2 and the converter 3 with new ones when necessary.

In the present embodiment, the electric power conversion apparatus 1 includes the two electric power conversion devices, i.e., the inverter 2 that converts DC power into AC power and the converter 3 that converts DC power of one voltage to DC power of another voltage.

Consequently, with the combination of the inverter 2 and the converter 3, it is possible for the electric power conversion apparatus 1 to satisfy the requirements of electric power conversion in an electric vehicle or a hybrid vehicle.

In the present embodiment, the coolant passage 5 is made up of the recess 44 that is formed in the lower surface 422 of the partition wall 42 of the housing 4. Further, the recess 44 is covered by the converter 3 which is disposed in contact with the lower surface 422 of the partition wall 42.

With the above configuration, the converter 3 faces the coolant passage 5 and is thus directly exposed to the coolant flowing through the coolant passage 5. Consequently, it is possible to cool, with the coolant flowing through the coolant passage 5, the converter 3 as well as the housing 4. As a result, it is possible to more effectively suppress increase in the ambient temperature within the lower part 402 of the housing 4.

Further, in the present embodiment, the converter 3 is hermetically fixed to the lower surface 422 of the partition wall 42 of the housing 4.

With the above configuration, it is possible to ensure the hermeticity of the coolant passage 5.

In the present embodiment, the inverter 2 includes the semiconductor modules 21 and the cooling pipes 22 for cooling the semiconductor modules 21. On the other hand, the converter 3 is disposed to abut the coolant passage 5 formed in the partition wall 42 of the housing 4.

With the above configuration, it is possible to cool the semiconductor modules 21 of the inverter 2 with the coolant flowing through the cooling pipes 22 while cooling the converter 3 with the coolant flowing through the coolant passage 5 formed in the partition wall 42. Consequently, it is possible to sufficiently cool each of the inverter 2 and the converter 3, thereby effectively suppressing increase in the ambient temperature in the entire space inside the housing 4.

Further, in the present embodiment, the semiconductor modules 21 are alternately stacked with the cooling pipes 22.

With the above configuration, it is possible to more effectively cool the semiconductor modules 21 with the coolant flowing through the cooling pipes 22.

In the present embodiment, the electric power conversion apparatus 1 is used in a motor vehicle.

As described previously, it is possible to effectively suppress increase in the ambient temperature in the entire space inside the housing 4; thus, it is possible to ensure the heat resistance of the electric power conversion apparatus 1. Moreover, with the arrangement of the inverter 2 and the converter 3 in the housing 4, it is possible to minimize the size of the electric power conversion apparatus 1. As a result, when the electric power conversion apparatus 1 is used in a motor vehicle, it is possible to improve flexibility in mounting the electric power conversion apparatus 1 in the motor vehicle.

Second Embodiment

This embodiment illustrates an electric power conversion apparatus 1 which has almost the same configuration as the electric power conversion apparatus 1 according to the first embodiment; accordingly, only the differences therebetween will be described hereinafter.

In the first embodiment, the recess 44 formed in the lower surface 422 of the partition wall 42 of the housing 4, which makes up the coolant passage 5, is covered by the converter 3 that is disposed in contact with the lower surface 422 of the partition wall 42.

Figure 4:
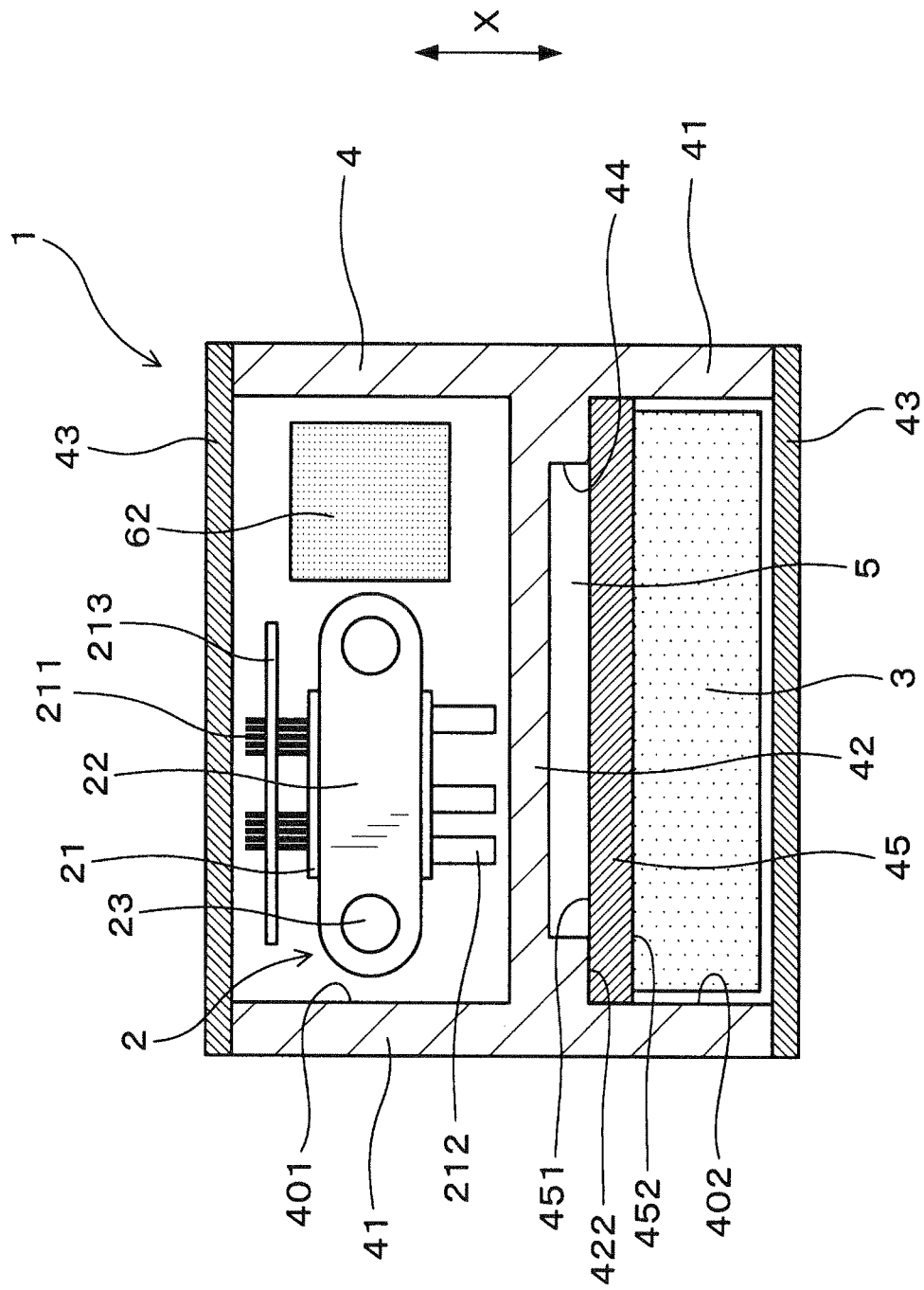
FIG. 4 is a schematic view illustrating the overall configuration of an electric power conversion apparatus according to a second embodiment.

In comparison, in the present embodiment, as shown in FIG. 4, the recess 44 formed in the lower surface 422 of the partition wall 42 of the housing 4 is covered by a plate-shaped lid member 45 that is disposed in contact with the lower surface 422 of the partition wall 42. Consequently, an upper surface 451 of the lid member 45 faces the coolant passage 5 and is thus directly exposed to the coolant flowing through the coolant passage 5. Moreover, on a lower surface 452 of the lid member 45, there is mounted the converter 3. In addition, it is also possible to form heat-radiating fins on the upper surface 451 of the lid member 45, thereby improving the cooling performance.

Further, in the present embodiment, the lid member 45 is fixed, for example by bolts (not shown), to the lower surface 422 of the partition wall 42 via a seal member (not shown) such as a liquid gasket and rubber. In other words, the lid member 45 is hermetically fixed to the lower surface 422 of the partition wall 42. Consequently, the hermeticity of the coolant passage 5 is ensured. In addition, it is also possible to fix both the lid member 45 and the converter 3 together to the lower surface 422 of the partition wall 42 by, for example, bolts.

In operation, the housing 4 is cooled by the coolant flowing through the coolant passage 5 formed in the partition wall 42. Moreover, the converter 3 is also cooled by the coolant flowing through the coolant passage 5 via the lid member 45.

The above-described electric power conversion apparatus 1 according to the present embodiment has the same advantages as the electric power conversion apparatus 1 according to the first embodiment.

In addition, in the present embodiment, since the converter 3 is mounted on the lower surface 452 of the lid member 45, it is possible to more easily replace the converter 3 with a new one when necessary.

Third Embodiment

This embodiment illustrates an electric power conversion apparatus 1 which has almost the same configuration as the electric power conversion apparatus 1 according to the first embodiment; accordingly, only the differences therebetween will be described hereinafter.

In the first embodiment, the partition wall 42 of the housing 4 has only the single coolant passage 5 formed therein (see FIG. 2).

Figure 5:
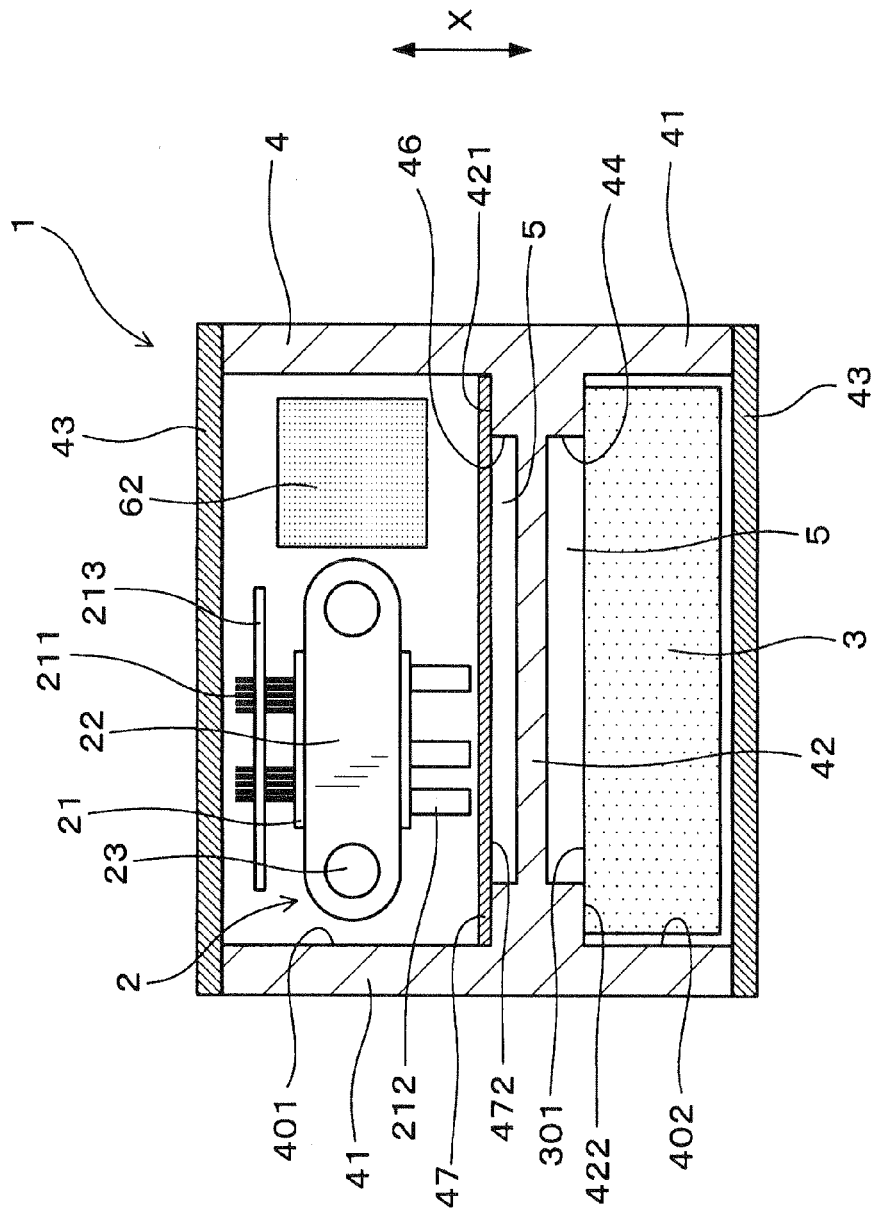
FIG. 5 is a schematic view illustrating the overall configuration of an electric power conversion apparatus according to a third embodiment.

In comparison, in the present embodiment, as shown in FIG. 5, the partition wall 42 of the housing 4 has a pair of first and second coolant passages 5 formed therein.

The first coolant passage 5 is identical to the coolant passage 5 in the first embodiment. That is, the first coolant passage 5 is made up of a recess 44 which is formed in the lower surface 422 of the partition wall 42 and covered by the converter 3 that is disposed in contact with the lower end surface 422.

On the other hand, the second coolant passage 5 is made up of a recess 46 which is formed in the upper surface 421 of the partition wall 42 and covered by a plate-shaped lid member 47 that is disposed in contact with the upper surface 421 of the partition wall 42. In addition, it is also possible to form heat-radiating fins on a lower surface 472 of the lid member 47 which faces the second coolant passage 5, thereby improving the cooling performance.

The above-described electric power conversion apparatus 1 according to the present embodiment has the same advantages as the electric power conversion apparatus 1 according to the first embodiment.

In addition, in the present embodiment, by making the coolant to flow through both the first and second coolant passages 5 formed in the partition wall 42 of the housing 4, it is possible to more effectively cool the housing 4 and more effectively suppress increase in the ambient temperature within upper part 401 of the housing 4.

Fourth Embodiment

This embodiment illustrates an electric power conversion apparatus 1 which has almost the same configuration as the electric power conversion apparatus 1 according to the first embodiment; accordingly, only the differences therebetween will be described hereinafter.

Figure 6:
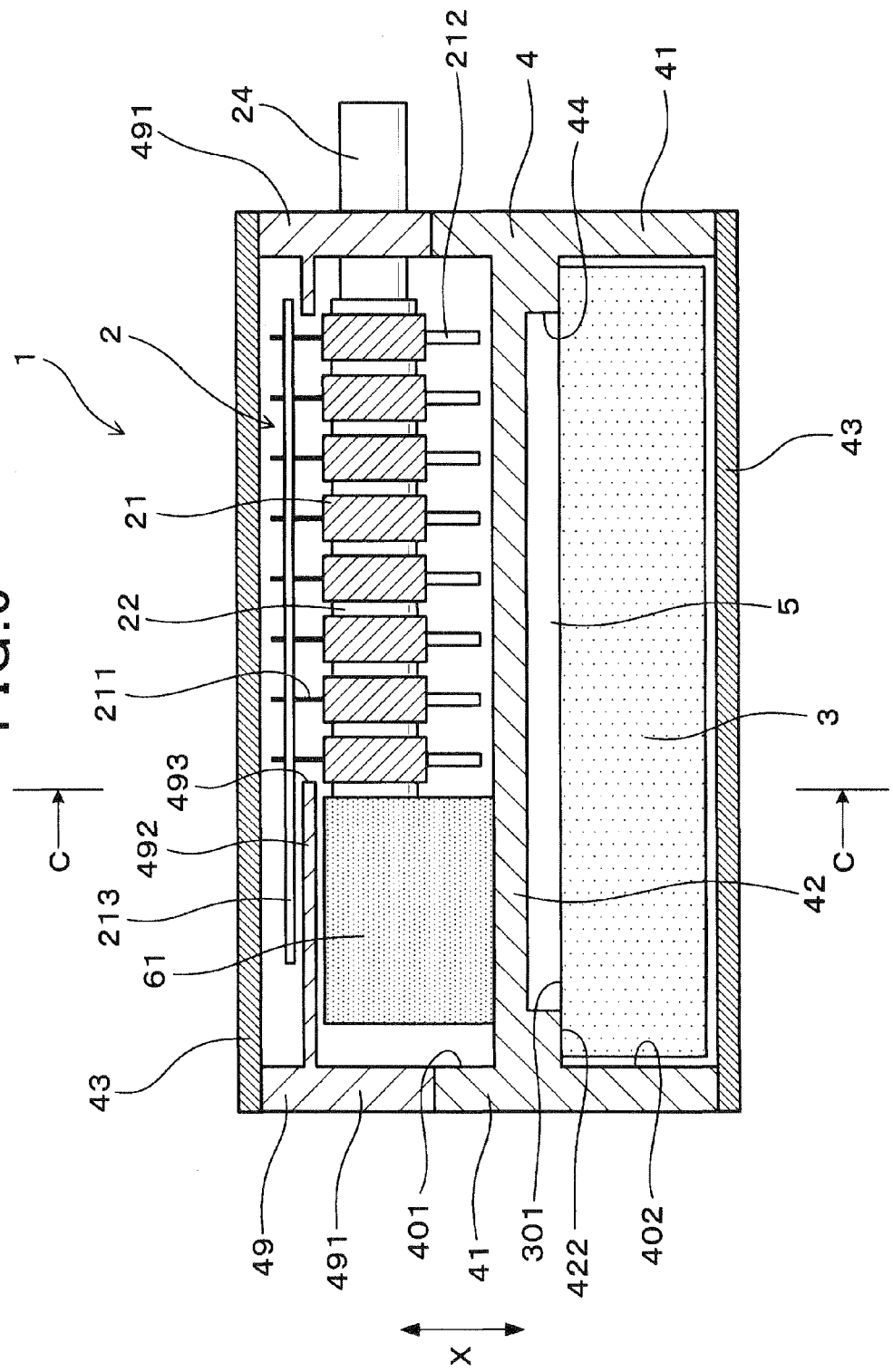
FIG. 6 is a schematic view illustrating the overall configuration of an electric power conversion apparatus according to a fourth embodiment.
Figure 7:
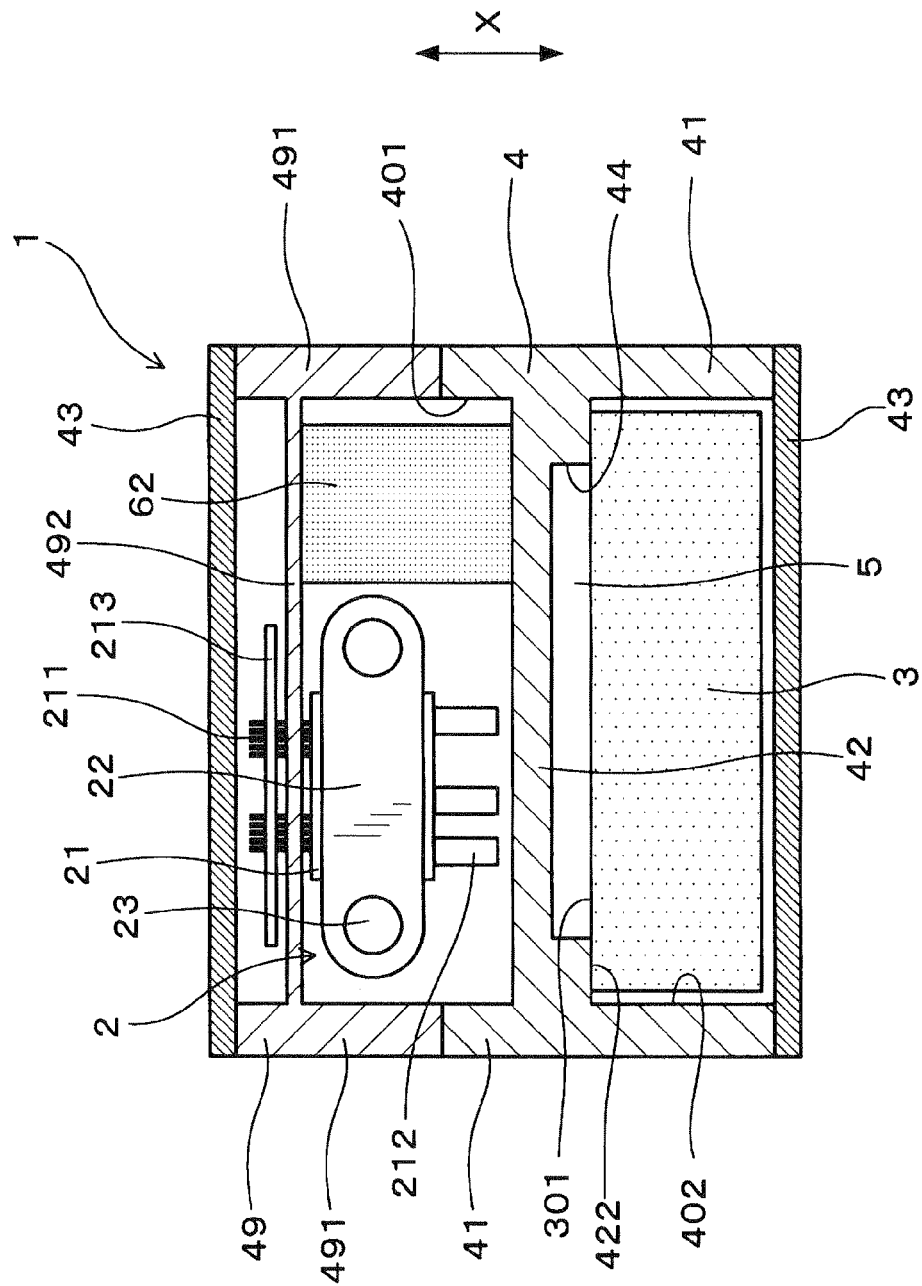
FIG. 7 is a cross-sectional view taken along the line C-C in FIG. 6.

In the present embodiment, as shown in FIGS. 6 and 7, the electric power conversion apparatus 1 further has a housing 49 disposed on the housing 4.

Specifically, the housing 49 has four side walls 491 each of which extends in the vertical direction X and is disposed on a corresponding one of the side walls 41 of the housing 4. The housing 49 also has a mounting wall 492 for mounting the reactor 61 and the capacitor 62. The mounting wall 492 extends horizontally to partition the space enclosed by the four side walls 491. Consequently, the housing 49 is given a substantially "H"-shaped cross section parallel to the vertical direction X and partitioned into upper and lower parts. Further, the open end of the upper part of the housing 49 is closed by a cover 43.

Moreover, the mounting wall 492 of the housing 49 has a through-hole 493 formed therein. The control terminals 211 of the semiconductor modules 21 extend through the through-hole 493 of the mounting wall 492 so as to be connected to the control circuit board 213 that is arranged upward of the mounting wall 492.

Furthermore, in the present embodiment, both the reactor 61 and the capacitor 62 of the inverter 2 are directly disposed on and thus in contact with the partition wall 42 of the housing 4. Consequently, both the reactor 61 and the capacitor 62 of the inverter 2 are thermally connected to the coolant flowing through the coolant passage 5 via the partition wall 42 of the housing 4.

The above-described electric power conversion apparatus 1 according to the present embodiment has the same advantages as the electric power conversion apparatus 1 according to the first embodiment.

In addition, in the present embodiment, both the reactor 61 and the capacitor 62 of the inverter 2 can be indirectly cooled by the coolant flowing through the coolant passage 5 via the partition wall 42 of the housing 4. As a result, it is more effectively suppress increase in the ambient temperature inside the electric power conversion apparatus 1.

While the above particular embodiments have been shown and described, it will be understood by those skilled in the art that various modifications, changes, and improvements may be made without departing from the spirit of the invention.

For example, in the second embodiment, the reactor 61 is received in the upper part 401 of the housing 4 as shown in FIG. 4.

However, the reactor 61 may also be received in the lower part 402 of the housing 4 and fixed to the lower surface 452 of the lid member 45 together with the converter 3. In this case, since the reactor 61, which is heaviest among the components of the electric power conversion apparatus 1, is located in the lower part 402 of the housing 4, the center of gravity of the electric power conversion apparatus 1 is lowered, thereby improving the vibration resistance of the apparatus 1. Further, it is also possible to suppress propagation of electromagnetic noise generated by the reactor 61 using the seal member (not shown) interposed between the lid member 45 and the lower surface 422 of the partition wall 42 of the housing 4. In addition, when the inverter 2 is larger in size than the converter 3, by arranging the reactor 61 in the lower part 402 of the housing 4, it is possible to more fully utilize the internal space of the housing 4, thereby further reducing the size of the electric power conversion apparatus 1.

In the fourth embodiment, both the reactor 61 and the capacitor 62 of the inverter 2 are arranged so as to be indirectly cooled by the coolant flowing through the coolant passage 5.

However, either or both of the reactor 61 and the capacitor 62 may also be arranged in the same manner as the converter 3, so as to be exposed to and thereby directly cooled by the coolant flowing through the coolant passage 5.

What is claimed is:

1. An electric power conversion apparatus comprising:
   first and second electric power conversion devices that are arranged to overlap each other in an overlap direction; and
   a housing that receives both the first and second electric power conversion devices therein,
   wherein
   the housing has a partition wall that extends between the first and second electric power conversion devices to partition the housing into first and second parts in which the first and second electric power conversion devices are respectively received, and
   the partition wall has a coolant passage formed therein, thereby allowing a coolant to flow through the coolant passage.

2. The electric power conversion apparatus as set forth in claim 1, wherein the housing also has a plurality of side walls that each extend in the overlap direction and together enclose both the first and second electric power conversion devices.

3. The electric power conversion apparatus as set forth in claim 1, wherein the coolant passage is made up of a recess that is formed in a surface of the partition wall of the housing, the surface facing one of the first and second electric power conversion devices, and
   the one of the first and second electric power conversion devices is disposed in contact with the surface of the partition wall so as to cover the recess formed in the surface.

4. The electric power conversion apparatus as set forth in claim 3, wherein the one of the first and second electric power conversion devices is hermetically fixed to the surface of the partition wall of the housing.

5. The electric power conversion apparatus as set forth in claim 1, wherein the coolant passage is made up of a recess that is formed in a surface of the partition wall of the housing,
   the recess is covered by a lid member that has an opposite pair of first and second surfaces, and
   the first surface abuts the surface of the partition wall of the housing, and the second surface has one of the first and second electric power conversion devices mounted thereon.

6. The electric power conversion apparatus as set forth in claim 5, wherein the lid member is hermetically fixed to the surface of the partition wall of the housing.

7. The electric power conversion apparatus as set forth in claim 1, wherein the first electric power conversion device is an inverter that converts DC power into AC power, and the second electric power conversion device is a converter that converts DC power of one voltage into DC power of another voltage.

8. The electric power conversion apparatus as set forth in claim 7, wherein the inverter includes at least one semiconductor module and at least one cooling portion for cooling the at least one semiconductor module, and
   the converter is disposed to abut the coolant passage formed in the partition wall of the housing, so as to be cooled by the coolant flowing through the coolant passage.

9. The electric power conversion apparatus as set forth in claim 8, wherein the at least one semiconductor module comprises a plurality of semiconductor modules,
   the at least one cooling portion comprises a plurality of cooling pipes through which the coolant flows, and
   the semiconductor modules are alternately stacked with the cooling pipes.

10. The electric power conversion apparatus as set forth in claim 8, wherein the inverter further includes at least one electronic component in addition to the at least one semiconductor module and the at least one cooling portion, and
    the at least one electronic component is disposed so as to be directly or indirectly cooled by the coolant flowing through the coolant passage formed in the partition wall of the housing.

11. The electric power conversion apparatus as set forth in claim 1, wherein the electric power conversion apparatus is used in a motor vehicle.

* * * * *